(12) United States Patent
Derat

(10) Patent No.: US 10,788,524 B2
(45) Date of Patent: Sep. 29, 2020

(54) SYSTEM AND METHOD FOR PERFORMING A TEST

(71) Applicant: Rohde & Schwarz GmbH & Co. KG, Munich (DE)

(72) Inventor: Benoît Derat, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 41 days.

(21) Appl. No.: 16/282,146

(22) Filed: Feb. 21, 2019

(65) Prior Publication Data

US 2020/0271709 A1    Aug. 27, 2020

(51) Int. Cl.
| | |
|---|---|
| *H04B 17/00* | (2015.01) |
| *G01R 29/08* | (2006.01) |
| *G01R 29/10* | (2006.01) |
| *H04J 13/00* | (2011.01) |
| *H04L 1/00* | (2006.01) |

(52) U.S. Cl.
CPC ....... *G01R 29/0892* (2013.01); *G01R 29/105* (2013.01); *H04B 17/0085* (2013.01); *H04J 13/004* (2013.01); *H04L 1/0003* (2013.01)

(58) Field of Classification Search
CPC ........... G01R 29/0821; G01R 29/0835; G01R 29/0892; G01R 29/10; G01R 29/105; H04B 17/00; H04B 17/0085; H04J 13/0007; H04J 13/004; H04L 1/0003
See application file for complete search history.

(56) References Cited

U.S. PATENT DOCUMENTS

| | | | |
|---|---|---|---|
| 2015/0188647 A1* | 7/2015 | Wang | H01Q 3/267 455/67.12 |
| 2018/0006745 A1* | 1/2018 | Vanwiggeren | H04B 17/354 |

* cited by examiner

*Primary Examiner* — Jimmy T Vu
(74) *Attorney, Agent, or Firm* — Christensen O'Connor Johnson Kindness PLLC

(57) ABSTRACT

A method of performing a test assigned to a quiet zone of a test chamber by using a test system is described. The test system comprises an antenna array with a plurality of antennas. The test system includes a measurement antenna adapted to establish a link to each one of the antennas of the antenna array. At least one measurement is performed over a coordinate surface. The antennas of the antenna array are fed with signals simultaneously, the signals having at least one of different frequencies and different orthogonal code-modulations. Alternatively or additionally, the antennas of the antenna array are switched electronically such that, in one spatial acquisition of the field over the coordinate surface, the field of each antenna of the antenna array is measured sequentially. Moreover, a test system is described.

13 Claims, 1 Drawing Sheet

SYSTEM AND METHOD FOR PERFORMING A TEST

FIELD OF DISCLOSURE

Embodiments of the present disclosure relate generally to a method of performing a test assigned to a quiet zone of a test chamber. Further, embodiments of the present disclosure relate generally to a test system for performing a test assigned to a quiet zone.

BACKGROUND

Modern communication devices have to be tested at an early stage in order to evaluate their characteristics, for instance their performance parameters. During the testing phase, the respective communication devices correspond to devices under test that are tested. Typically, those tests are performed in a test chamber of a test system that is also called antenna test range. The device under test is placed in a so-called quiet zone that ensures to measure the characteristics of the device under test with high measurement accuracy.

In order to ensure that the quality of the quiet zone satisfies the respective requirements, the quality of the quiet zone has to be tested previously. This may be done by ripple tests.

Accordingly, testing and evaluating the quality of the quiet zone is of high importance for ensuring high measurement accuracy and performing measurement uncertainty analysis later when a certain device under test is placed in the quiet zone for performance characterization.

However, the tests known in the state of the art take a long time due to testing several different antenna positions of a reference antenna within the quiet zone in order to test and evaluate the quality of the quiet zone. For instance, a typical sub-6 GHz ripple test according to CTIA will actually take about two days. An equivalent test using millimeter waves (mmWaves) would take several weeks.

So far, a brute force approach is employed wherein as many days as needed are taken in order to perform all radiation pattern measurements for all various antenna positions of the reference antenna. However, the time required for testing the quality of the quiet zone is very long which in turn increases the costs for performance testing significantly.

Thus, there is a need for a method as well as a test system that ensure to reduce the measurement time without impairing the accuracy of the testing.

SUMMARY

Embodiments of the present disclosure provide a method of performing a test assigned to a quiet zone of a test chamber by using a test system. The test system comprises an antenna array with a plurality of antennas. The test system further comprises a measurement antenna that is adapted to establish a link to each one of the antennas of the antenna array. The method comprises the following steps:

Performing at least one measurement over a coordinate surface, and

Switching the antennas of the antenna array electronically such that, in one spatial acquisition of the field over the coordinate surface, the field of each antenna of the antenna array is measured sequentially.

Further, embodiments of the present disclosure provide a method of performing a test assigned to a quiet zone of a test chamber by using a test system. The test system comprises an antenna array with a plurality of antennas. The test system comprises a measurement antenna adapted to establish a link to each one of the antennas of the antenna array. The method comprises the following steps:

Performing at least one measurement over a coordinate surface, and

Feeding the antennas of the antenna array with signals simultaneously, the signals having at least one of different frequencies and different orthogonal code-modulations (different frequencies and/or different orthogonal code-modulations).

Moreover, embodiments of the present disclosure provide a test system for performing a test assigned to a quiet zone. The test system comprises a test chamber, an antenna array and a measurement antenna. The test chamber encompasses the quiet zone. The antenna array and the measurement antenna both are assigned to the test chamber. The antenna array comprises a plurality of antennas. The measurement antenna is adapted to establish a link to each one of the antennas of the antenna array. The test system is configured to perform at least one measurement over a coordinate surface. The test system is configured to at least one of the following:

electronically switch the antennas of the antenna array such that, in one spatial acquisition of the field over the coordinate surface, the field of each antenna of the antenna array is measured sequentially, simultaneously feed the antennas of the antenna array with signals having different frequencies, and simultaneously feed the antennas of the antenna array with signals modulated with orthogonal codes.

Accordingly, a method and a test system are provided that ensure to reduce the measurement time required by a factor that is proportional to the number of antennas provided by the antenna array. The measurement time can be reduced, as the individual antennas of the antenna array and the measurement antenna establish a link with each other simultaneously or rather sequentially for each spatial acquisition of the field over the coordinate surface.

In other words, the antennas of the antenna array are controlled in a specific manner in order to ensure that the measurement time can be reduced since the antennas of the antenna array are electronically switched sequentially in each spatial acquisition, namely each relative position of the measurement antenna with respect to the coordinate surface. Hence, the field assigned to each individual antenna can be measured in succession without the need of repositioning an antenna.

Alternatively or additionally, the individual antennas of the antenna array are fed with different signals simultaneously wherein the different signals may be assigned to different frequencies and/or different orthogonal code-modulations. Then, measurements can be done simultaneously for each spatial acquisition.

The individual links established simultaneously between each antenna of the antenna array and the measurement antenna can be distinguished from each other due to the respective frequency and/or modulation.

Accordingly, the test system is generally configured to electronically switch the antennas of the antenna array and/or simultaneously feed the antennas with signals having different frequencies and/or different orthogonal code-modulations.

Put another way, the antennas are fed with different signals wherein the different signals are assigned to distinguishing frequencies and/or distinguishing modulations, particularly different orthogonal code-modulations. Alternatively or additionally, the antennas are controlled during the measurement(s) in an appropriate manner in order to ensure that the field of each antenna of the antenna array is measured sequentially for each relative position of the measurement antenna with respect to the coordinate surface.

The antenna array with the plurality of antennas replace the reference antenna known in the state of the art, which was repositioned in order to enable several tests with different (relative) measurement patterns, for instance different full spherical measurement patterns depending on the movement of the measurement antenna.

The present disclosure ensures that the measurement time can be reduced significantly since the antenna array used for performing the test assigned to the quiet zone remains stationary during the testing. In fact, the antennas of the antenna array are controlled differently.

The quality of the quiet zone can be evaluated in a fast manner since a single antenna array with a plurality antennas, for instance ten antennas, would usually require several different antenna positions, for instance ten, of a respective reference antenna used in order to measure the respective radiation patterns provided by the antenna array. In the respective example, the reduction of the measurement time may correspond to a factor close to ten as it is not required to reposition the potential reference antenna during the different measurements in order to obtain the ten different antenna positions corresponding to the individual antenna positions of the antennas of the antenna array.

In general, the antenna array corresponds to the specific size of the quiet zone. In other words, the antenna array was built to correspond to the specific size of the quiet zone to be tested. Typically, the antenna array has substantially the same size as the usable quiet zone, namely the portion of the quiet zone that has the respective characteristics intended. However, the antenna array may be bigger or smaller than the quiet zone. Then, the antenna array may be moved within the quiet zone. Nevertheless, the measurement time is reduced since several measurements may be performed for a single antenna position of the antenna array. Put another way, the number of different antenna positions is reduced significantly due to the antenna array used.

In the state of the art, a single reference antenna was measured at all points over the respective coordinate surface. Afterwards, the reference antenna was repositioned within the quiet zone wherein all points over the respective coordinate surface were measured again.

In contrast, the antenna array remains stationary wherein the field of each antenna or the antenna array may be measured sequentially in each spatial acquisition. Alternatively, the individual antennas of the antenna array are fed with different signals that enable to distinguish their respective contributions measured simultaneously in each spatial acquisition. In any case, repositioning of the antenna array is not required, which is time-consuming. In other words, the number of full measurement patterns, for instance full spherical measurement patterns, is reduced.

The coordinate surface generally bounds the quiet zone in order to define a measurement surface that comprises several measurement points that define the respective measurement pattern. The measurement antenna may be driven along the coordinate surface in order to conduct measurements at the respective measurement points on the coordinate surface.

The distance between the individual antennas of the antenna array is relatively large, ensuring that the antennas of the antenna array do not influence each other. Even if an influence occurs, this influence will be a fixed one. Hence, the influence can be determined by a previous calibration and, therefore, it can be compensated.

Generally, the test system may comprise a signal generator that generates the respective signal(s) used for feeding the individual antennas of the antenna array. The signal generator may be controlled by a control unit in an appropriate manner.

The control unit may further control a positioning unit that is assigned to the measurement antenna such that the measurement antenna can be driven along a pre-defined path in order to conduct measurements along the coordinate surface. The positioning unit may comprise an axis-positioning unit.

Instead of having one reference antenna that has to be placed manually at many different antenna positions, the antenna array is provided that may be positioned only once.

The individual antennas of the antenna array are controlled in a specific manner in order to ensure that the measurement time is reduced. For instance, the different antennas are activated sequentially for each spatial acquisition so that a single link between the measurement antenna and the respective antenna of the antenna array is established one after another.

Alternatively, the individual antennas meet respective polarization requirements that ensure to excite all antennas of the antenna array individually, but simultaneously. The respective polarization requirements may correspond to orthogonal signals, namely orthogonally modulations and/or slight frequency offsets. Thus, a single full assessment, namely one spatial acquisition of the field over the coordinate surface, is sufficient, as the radiation coming from all individual antennas in the specific spatial acquisition can be assessed simultaneously. Their respective contributions can be separated due to the orthogonality of the signals.

According to an aspect, the antenna array remains stationary while the field of each antenna of the antenna array is measured sequentially. In a similar manner, the antenna array remains stationary while the antennas of the antenna array are fed with signals simultaneously. Thus, the antenna array is stationary. As mentioned above, the antenna array is positioned within the test chamber, particularly the quiet zone, only once. Thus, it is not necessary to reposition the antenna array during the measurement(s). In fact, the different data is obtained due to controlling the individual antennas of the antenna array differently.

The measurement antenna may be driven along the coordinate surface in order to conduct several measurements at the respective measurement points assigned to the coordinate surface. In fact, a certain (radial) distance may be kept between the measurement antenna and the coordinate surface. However, the measurement antenna scans the coordinate surface appropriately in order to sample different measurements at respective locations.

In addition, the antennas of the antenna array may be orthogonally shifted. Thus, the antennas of the antenna array may be phase-shifted in an orthogonal manner. An orthogonal polarization of the antennas may be provided that ensure the orthogonal shift.

Alternatively or additionally, the signals forwarded to the individual antennas of the antenna arrays are orthogonally shifted with respect to each other, for instance due to a modulation and/or frequency (offset).

According to an aspect, the coordinate surface corresponds to at least one of a spherical surface and a cylindrical surface. The measurement antenna may be driven along the respective surface. A positioning unit may be assigned to the measurement antenna, which is configured to ensure the respective movement such that the specific coordinate surface can be used for testing.

Moreover, the test system may comprise a vector network analyzer and/or a signal analyzer. Depending on the specific measurement, a vector network analyzer may be required for evaluating the signals, particularly the different signals that are modulated in a distinguishable manner while being received simultaneously by the measurement antenna.

Another aspect provides that the signals having different orthogonal code-modulations may be demodulated afterwards. Thus, it is ensured that the information encompassed by the modulated signals can be evaluated.

Furthermore, all signals fed to the different antennas of the antenna array may have frequencies that differ from each other. Thus, no antenna is fed with a signal that has a frequency that was used for feeding another antenna of the antenna array. Put another way, all signals differ from each other with regard to their frequency. Thus, their contributions can be separated appropriately.

In fact, the frequencies or the signals may differ from each other in the range of Hertz. For instance, if the quiet zone is to be tested for a certain frequency at mmWave, it will be sufficient to vary the frequency of the different signals only by a few Hertz.

Because each of the different signals having different frequencies are forwarded to a corresponding antenna of the antenna array, it is possible to test all antennas of the antenna array at the same time. Thus, the measurement time required for testing the quiet zone is reduced significantly.

Another aspect provides that the test chamber comprises an anechoic chamber that encompasses the quiet zone. Anechoic chambers are used to simulate a free-space environment within a protected, closed volume. Moreover, interfering signals are shielded by the anechoic chamber that may disturb the measurements and, thus, imparting the accuracy. Hence, a substantially idle quiet zone is provided, as the quiet zone is encompassed by the anechoic chamber of the test system.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
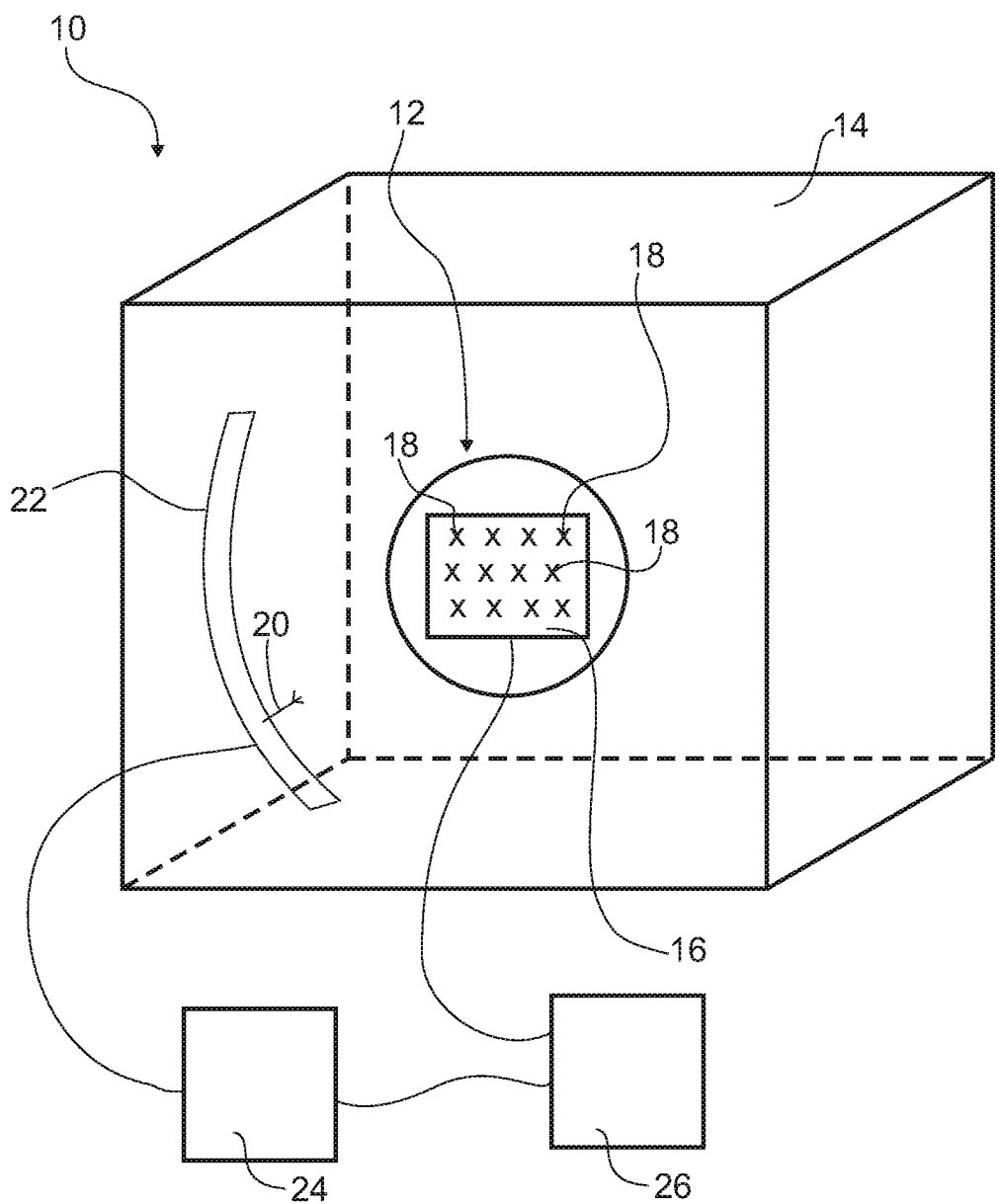
FIG. 1 schematically shows a test system according to the present disclosure.

FIG. 1 schematically shows a test system 10 for performing a test assigned to a quiet zone 12 that is encompassed by a test chamber 14 of the test system 10.

The test chamber 14 may generally comprise an anechoic chamber such that idle conditions corresponding a free-space environment can be obtained. Hence, disturbing or rather interfering signals are blocked.

Put another way, the test chamber 14 is an anechoic chamber such that the anechoic chamber encompasses the quiet zone 12.

The test system 10 is generally configured to test the quality of the quiet zone 12 so that the characteristics of the quiet zone 12 can be evaluated which is required for conducting performance tests of a certain device under test in the quiet zone 12 later.

For testing the quality of the quiet zone 12, the test system 10 comprises an antenna array 16 that has a plurality of individual antennas 18. As shown in FIG. 1, the antenna array 16 is placed in the quiet zone 12.

In addition, the test system 10 comprises a measurement antenna 20 that is configured to communicate with the antenna array 16. In fact, the measurement antenna 20 is adapted to establish a link to each one of the antennas 18 of the antenna array 16.

The measurement antenna 20 is assigned to a schematically shown positioning unit 22 that is configured to move the measurement antenna 20 relative to the quiet zone 12 as will be described later with reference to FIG. 2.

In general, the test system 10 is configured to perform at least one measurement over a coordinate surface that may encompass the antenna array 16.

Therefore, the measurement antenna 20 may be positioned with respect to the quiet zone 12, namely the respective coordinate surface, in order to conduct a certain measurement of the field provided by at least one of the antennas 18.

The coordinate surface may correspond to a spherical surface that may enclose the antenna array 16 entirely as schematically shown in FIG. 1. Alternatively, the coordinate surface may correspond to a cylindrical surface.

The respective coordinate surface used depends on the positioning unit 22 and its movement axes.

In fact, the measurement antenna 20 is moved by the positioning unit 22 along the respective coordinate surface enabling to conduct several measurements at measurement points assigned to the coordinate surface.

The positioning unit 22 may drive the measurement antenna 20 along the coordinate surface while maintaining a certain distance to the coordinate surface that limit the quiet zone 12, for instance. In any case, the measurements are conducted on the coordinate surface.

Generally, the antenna array 16 as well as the measurement antenna 20 both are assigned to the test chamber 14, in particular the quiet zone 12, such that the quality of the quiet zone 12 can be evaluated by evaluating the signals exchanged between the individual antennas 18 of the antenna array 16 and the measurement antenna 20, particularly the signal(s) received by the measurement antenna 20.

In addition, the test system 10 comprises a control and/or evaluation unit 24 that is, inter alia, configured to control the individual antennas 18 of the antenna array 16 as will be described hereinafter with reference to FIG. 2.

Moreover, the control and/or evaluation unit 24 is configured to evaluate the signals measured by the measurement antenna 20 in order to evaluate the quality of the quiet zone 12.

The control and/or evaluation unit 24 may correspond to a common device as shown in FIG. 1. Alternatively, the control and/or evaluation unit 24 may be formed separately such that a control device and a separately formed evaluation device are provided. For instance, the control and/or evaluation unit 24 may correspond to a vector network analyzer or a signal analyzer.

In addition, the test system 10 may comprise a signal generator 26 that is controlled by the control and/or evaluation unit 24. However, the signal generator 26 may also be integrated in the control and/or evaluation unit 24.

The signal generator 26 may be connected with the antenna array 16 such that the signal(s) generated are/is fed to the individual antennas 18 of the antenna array 16 for transmitting purposes.

Figure 2:
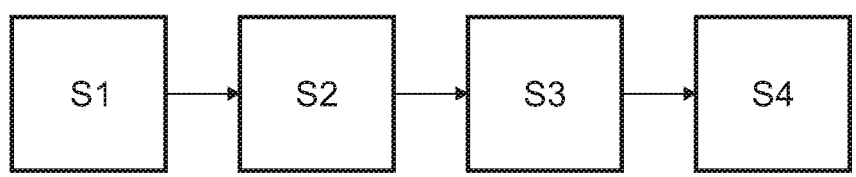
FIG. 2 shows a flow chart of a method of performing a test assigned to a quiet zone of a test chamber according to the present disclosure.

In FIG. 2, a flow chart is shown that illustrates a method of performing a test assigned to the quiet zone 12 of the test chamber 14 in order to evaluate the quality of the test chamber 14.

In a first step S1, the antenna array 16 is placed within the test chamber 14 and connected to the control and/or evaluation unit 24, in particular via the signal generator 26.

In a second step S2, the measurement antenna 20 is placed in the test chamber 14 wherein the measurement antenna 20 is also connected with the control and/or evaluation unit 24. Furthermore, the measurement antenna 20 may be connected to the positioning unit 22. Hence, the measurement antenna 20 together with the positioning unit 22 may be placed in the test chamber 14.

Otherwise, the measurement antenna 20 and the positioning unit 22 are already provided in the test chamber 14.

In any case, both the measurement antenna 20 as well as the antenna array 16 are assigned to the test chamber 14. In fact, the measurement antenna 20 may be orientated towards the quiet zone 12.

In a third step S3, at least one measurement over the coordinate surface is performed wherein the control and/or evaluation unit 24 controls the individual antennas 18 of the antenna array 16 in a certain manner as described in step S4. Generally, the at least one measurement over the coordinate surface is enabled by moving the measurement antenna 20 relative to the quiet zone 12.

In a fourth step S4, the antennas 18 are electronically switched such that, in one spatial acquisition of the field over the coordinate surface, namely one relative position of the measurement antenna 20 with respect to the quiet zone 12, the field of each antenna 18 of the antenna array 16 is measured sequentially.

Thus, the control and/or evaluation unit 24 controls the antennas 18 individually by electronically switching the antennas 18 such that only one of the plurality of antennas 18 is active at the same time. Accordingly, all antennas 18 of the antenna array 16 are activated subsequently while the measurement antenna 20 remains at a certain position with respect to the quiet zone 12.

The control and/or evaluation unit 24 may receive the signals received by the measurement antenna 20, which were transmitted by the single active antenna 18 of the antenna array 16 one after another.

Then, the control and/or evaluation unit 24 evaluates the respective signal(s) received in order to obtain characterizing parameters assigned to the quiet zone 12 that can be used to determine the quality of the quiet zone 12.

After all antennas 18 of the antenna array 16 have been activated for the respective spatial acquisition, the positioning unit 22 moves the measurement antenna 20 in order to reach a next measurement position with regard to the coordinate surface.

Then, the control and/or evaluation unit 24 may control the individual antennas 18 of the antenna array 16 again such that only one of the plurality of antennas 18 is active at the same time. Again, all antennas 18 are activated in a sequential manner. The respective signals transmitted are received by the measurement antenna 20 and evaluated by the control and/or evaluation unit 24.

Alternatively, the antennas 18 of the antenna array 16 are fed simultaneously with signals in the fourth step S4, wherein the signals have different frequencies.

Thus, the control and/or evaluation unit 24 may control the signal generator 26 assigned to the antenna array 16 such that signals are generated that have slightly different frequencies with respect to each other.

For instance, the frequencies of the signals may differ from each other in the range of Hertz, particularly for signals having a wavelength assigned to mmWave.

The antennas 18 simultaneously receive the respective signals generated by the signal generator 26 such that the different signals are transmitted by the antennas 18 at the same time.

The signals transmitted by the antennas 18 are received by the measurement antenna 20 simultaneously while the measurement antenna 20 is assigned to a single spatial acquisition.

Then, the received signals are forwarded to the control and/or evaluation unit 24 for evaluating purposes.

The control and/or evaluation unit 24 is configured to evaluate the different contributions of the different signals received simultaneously due to the different signals, namely the different frequencies. Put another way, the different contributions of the different signals received can be separated so as to obtain information with regard to different positions assigned to the different locations of the individual antennas 18.

Afterwards, the measurement antenna 20 is driven by the positioning unit 22 along the coordinate surface until the next measurement position is reached. In the next measurement position assigned to another spatial acquisition, the antennas 18 are again fed with different signals simultaneously which are received by the measurement antenna 20 at the same time.

Alternatively or additionally, the antennas 18 of the antenna array 16 are fed simultaneously in the fourth step S4 with signals that are modulated with different orthogonal codes. In other words, the signals have different orthogonal code-modulations.

Again, all antennas 18 of the antenna array 16 receive the respective modulated signals generated by the signal generator 26 at the same time such that the antennas 18 transmit the respective signals simultaneously.

The measurement antenna 20 receives the different signals transmitted at the same time wherein the signals received are forwarded to the control and/or evaluation unit 24 for evaluating purposes.

Afterwards, the positioning unit 22 moves the measurement antenna 20 to the next spatial acquisition as described above.

In general, the antenna array 16, which was positioned in the test chamber 14 only once, remains stationary during the different measurements since the antennas 18 of the antenna array 16 are controlled by the control and/or evaluation unit

24 differently. Thus, different measurements can be conducted in less time compared to methods known in the state of the art.

In case of modulated signals, the control and/or evaluation unit 24 demodulates the signals received in order to derive at the respective information contained in the modulated signals.

Generally, the test system 10 is configured to perform at least one of the above-mentioned alternatives.

In other words, the test system 10 is configured to electronically switch the antennas 18 of the antenna array 16 in the manner mentioned above and/or simultaneously feed the antennas 18 of the antenna array 16 with different. The different signals may have different frequencies and/or different orthogonal code-modulations.

Since the antenna array 16 remains stationary during the individual measurements conducted, the measurement time required for testing the quality of the quiet zone 12 can be reduced significantly.

In fact, the measurement time can be reduced by a factor that corresponds to a number of antennas 18 of the antenna array 16 since it is not necessary to position the antenna array 16 to different positions.

Generally, the antennas 18 of the antenna array 16 may be orthogonally shifted.

Furthermore, the signals transmitted by the antennas 18, which have different frequencies and/or different modulations, result in the respective orthogonality required for separating the respective contributions.

Any module or unit described herein may be established by software modules so that a computer program is provided that may be used by the control/evaluation unit 24 and/or the signal generator 26. The computer program has a program code adapted to cause the control/evaluation unit 24 and/or the signal generator 26 to perform the steps mentioned above when the computer program is run on the control/evaluation unit 24 and/or the signal generator 26. Alternatively, the modules may be established by hardware circuitry, or combination of software and hardware circuitry.

It will then be appreciated that one or more aspects of the methods set forth herein can be carried out in a computer system. In this regard, a program element is provided, which is configured and arranged when executed on a computer to perform a test assigned to a quite zone of a test chamber. In one embodiment, the program element may be specifically be configured to perform the steps of: performing at least one measurement over a coordinate surface; and at least one of: (1) feeding the antennas of the antenna array with signals simultaneously, the signals having at least one of different frequencies and different orthogonal code-modulations; and (2) switching the antennas of the antenna array electronically such that, in one spatial acquisition of the field over the coordinate surface, the field of each antenna of the antenna array is measured sequentially.

The program element may be installed in memory, such as computer readable storage medium. The computer readable storage medium may be any one of the computing devices, modules, instruments, analyzers, post processing units, etc., described elsewhere herein or another and separate computing device, modules, instruments, analyzers, post processing unit, etc., as may be desirable. The computer readable storage medium and the program element, which may comprise computer-readable program code portions embodied therein, may further be contained within a non-transitory computer program product.

As mentioned, various embodiments of the present disclosure may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, optical disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. Other non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM) of any rate, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

The computer-readable media include cooperating or interconnected computer-readable media, which exist exclusively on a processing system or distributed among multiple interconnected processing systems that may be local to, or remote from, the processing system.

As should be appreciated, various embodiments of the present disclosure may be also implemented as methods, apparatus, systems, computing devices, computing entities, and/or the like, as have been described elsewhere herein or claimed below. As such, embodiments of the present disclosure may take the form of an apparatus, system, computing device, computing entity, and/or the like executing instructions stored on a computer-readable storage medium to perform certain steps or operations. However, embodiments of the present disclosure may also take the form of an entirely hardware embodiment performing certain steps or operations.

Various embodiments are described above with reference to block diagrams and/or flowchart illustrations of apparatuses, methods, systems, and computer program products. It should be understood that each block of any of the block diagrams and/or flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks and/or carry out the methods described herein.

These computer program instructions may also be stored in a computer-readable memory, such as the computer-readable storage media described above, that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, could be implemented by special purpose hardware-based computer systems or circuits, etc., that perform the specified functions or operations, or combinations of special purpose hardware and computer instructions.

According to some embodiments, many individual steps of a process may or may not be carried out utilizing the computer systems described herein, and the degree of computer implementation may vary, as may be desirable and/or beneficial for one or more particular applications.

It should now be appreciated that some embodiments of the present disclosure, or portions thereof, have been described in the general context of computer code or machine-useable instructions, including computer-executable instructions such as program modules, being executed by a computing system, or other machine or machines. Some of these embodiments or others may be implemented using a variety of system configurations, including handheld devices, consumer electronics, general-purpose computers, more specialty computing devices, etc. Embodiments described herein may also be implemented in distributed computing environments, using remote-processing devices that are linked through a communications network or the Internet.

For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of performing a test assigned to a quiet zone of a test chamber by using a test system, the test system comprising an antenna array with a plurality of antennas, the test system comprising a measurement antenna adapted to establish a link to each one of the antennas of the antenna array, the method comprising the steps of:
    (a) performing at least one measurement over a coordinate surface; and
    (b) at least one of:
        (1) feeding the antennas of the antenna array with signals simultaneously, the signals having at least one of different frequencies and different orthogonal code-modulations; and
        (2) switching the antennas of the antenna array electronically such that, in one spatial acquisition of the field over the coordinate surface, the field of each antenna of the antenna array is measured sequentially.

2. The method according to claim 1, wherein the antenna array remains stationary while the field of each antenna of the antenna array is measured sequentially.

3. The method according to claim 1, wherein the antennas of the antenna array are orthogonally shifted.

4. The method according to claim 1, wherein the coordinate surface corresponds to at least one of a spherical surface and a cylindrical surface.

5. The method according to claim 1, wherein the signals having different orthogonal code-modulations are demodulated afterwards.

6. The method according to claim 1, wherein all signals fed to the different antennas of the antenna array have frequencies that differ from each other.

7. The method according to claim 1, wherein the frequencies of the signals differ from each other in the range of Hertz.

8. The method according to claim 1, wherein the test system comprises at least one of a vector network analyzer and a signal analyzer.

9. A test system for performing a test assigned to a quiet zone, the test system comprising a test chamber, an antenna array and a measurement antenna, the test chamber encompassing the quiet zone, the antenna array and the measurement antenna both being assigned to the test chamber, the antenna array comprising a plurality of antennas, the measurement antenna being adapted to establish a link to each one of the antennas of the antenna array, the test system being configured to perform at least one measurement over a coordinate surface, wherein the test system is configured to at least one of the following:
    electronically switch the antennas of the antenna array such that, in one spatial acquisition of the field over the coordinate surface, the field of each antenna of the antenna array is measured sequentially;

simultaneously feed the antennas of the antenna array with signals having different frequencies; and simultaneously feed the antennas of the antenna array with signals modulated with orthogonal codes differently.

10. The test system according to claim 9, wherein the measurement antenna is stationary.

11. The test system according to claim 9, wherein the antennas of the antenna array are orthogonally shifted.

12. The test system according to claim 9, wherein the test chamber comprises an anechoic chamber that encompasses the quiet zone.

13. The test system according to claim 9, wherein the test system comprises at least one of a vector network analyzer and a signal analyzer.

* * * * *